United States Patent [19]

Ito

[11] Patent Number: 5,884,236
[45] Date of Patent: Mar. 16, 1999

[54] CALIBRATION METHOD OF IC TESTER

[75] Inventor: Koichi Ito, Tokyo, Japan

[73] Assignee: Ando Electric Co., Ltd., Tokyo, Japan

[21] Appl. No.: 989,311

[22] Filed: Dec. 12, 1997

[30] Foreign Application Priority Data

Dec. 13, 1996 [JP] Japan ..................................... 8-334268

[51] Int. Cl.⁶ ................................................. G01R 31/28
[52] U.S. Cl. ................................ 702/89; 371/1; 371/27.6; 702/117; 702/125; 324/73.1; 324/158.1; 324/617; 368/113; 368/118
[58] Field of Search ............................. 702/89, 117, 125; 395/183.01; 371/1, 27.6, 25.1, 21.1, 22.1; 324/73.1, 158.1, 765, 617; 368/118, 113, 10, 120

[56] References Cited

U.S. PATENT DOCUMENTS

| | | | |
|---|---|---|---|
| 4,433,414 | 2/1984 | Carey | 371/27.6 |
| 4,497,056 | 1/1985 | Sugamori | 371/25.1 |
| 4,517,661 | 5/1985 | Graf et al. | 395/183.01 |
| 4,631,724 | 12/1986 | Shimizu | 371/21.1 |
| 4,928,278 | 5/1990 | Otsuji et al. | 371/1 |
| 5,225,775 | 7/1993 | Sekino | 324/158.1 |
| 5,305,329 | 4/1994 | Sasaki | 371/27.6 |
| 5,701,306 | 12/1997 | Arai | 371/22.1 |
| 5,703,489 | 12/1997 | Kuroe | 324/601 |

*Primary Examiner*—John Barlow
*Assistant Examiner*—Hien Vo
*Attorney, Agent, or Firm*—Fish & Richardson P.C.

[57] ABSTRACT

A calibration method is provided for an IC tester which performs testing of ICs in association with a computer having a storage. A calibration file corresponding to results of calibration is stored by the computer. At first, the IC tester loads correction information representing results of a previous calibration from the computer. Then, a value of time propagation delay (TPD) is measured with respect to a pin selected from among pins of an IC and is compared with the correction information. The IC tester corrects a delay time provided for the pin whose value of TPD differs from the correction information. Thereafter, the correction information is renewed using the corrected delay time, so that the renewed correction information is stored by the computer. Thus, the IC tester completes the calibration prior to the testing of the IC. By the way, the correction of the delay time is made if the measured value of TPD is substantially different from the correction information, or if a prescribed time has already elapsed after the previous calibration. In addition, the pins of the IC can be partitioned into blocks, so that the value of TPD is measured with respect to a pin belonging to each of the blocks. Because the calibration is performed with respect to the selected pins only, it is possible to reduce calibration time which is required before the testing of the IC.

8 Claims, 3 Drawing Sheets

CALIBRATION METHOD OF IC TESTER

BACKGROUND OF THE INVENTION

1. Field of the Invention

This invention relates to calibration methods of IC testers which perform testing of ICs to examine their quality in manufacturing. This application is based on patent application No. Hei 8-334268 filed in Japan, the content of which is incorporated herein by reference.

2. Prior Art

The IC tester is designed to perform testing of ICs (where 'IC' stands for 'Integrated Circuit') to make a decision as to whether the ICs are manufactured with good quality or not. In the testing, the IC tester supplies test signals to pins of a testing IC which is subjected to testing. However, due to some factors or variations, dispersion occurs on delay times of wires of the pins of the IC. To cancel the above dispersion, a timing calibration is provided between a supply source of the test signals and the pins of the IC.

Normally, the timing calibration is realized using timing correction elements (e.g., skew ducks) which are provided between the supply source of the test signals and the pins of the IC. Herein, an amount of correction corresponding to each timing correction element is managed by a computer, for example.

FIG. 3 is a flowchart showing procedures for preparation of the testing which the conventional IC tester performs. Incidentally, the flowchart of FIG. 3 shows a flow of steps which a control unit (not shown) of the IC tester performs.

Given an instruction to start testing, the control unit makes a confirmation as to whether or not a calibration file exists in step Sa1. That is, the control unit determines whether or not calibration has been previously carried out at least one time.

The calibration file contains calibration data corresponding to timing correction values which are used when the calibration is carried out. The calibration file is written into a storage (not shown) which is equipped in the control unit.

In the aforementioned step Sa1, if the control unit detects that no calibration file exists, the control unit proceeds to step Sa4, the content of which will be described later.

On the other hand, if the control unit detects in step Sa1 that the calibration file exists, the control unit proceeds to step Sa2 to determine as to whether or not a prescribed time has elapsed after the "previous" calibration.

If the prescribed time has not elapse after the previous calibration, the control unit proceeds to step Sa5, the content of which will be described later.

If the prescribed time has elapsed after the previous calibration, the control unit proceeds to step Sa3. Herein, a temperature detector (not shown) equipped in the IC tester is used to measure temperature. So, the control unit determines, in step Sa3, whether or not a variation of temperature, which occurs after the previous calibration, is greater than a prescribed value of temperature.

If the variation of temperature after the previous calibration is not greater than the prescribed value of temperature, the control unit proceeds to step Sa5.

On the other hand, if the variation of temperature after the previous calibration is greater than the prescribed value of temperature, the control unit proceeds to step Sa4 in which calibration is performed with respect to all of the pins of the testing IC.

Thereafter, the control unit proceeds to step Sa5 in which calibration data such as the time to perform the calibration, temperature and timing correction values are stored in the calibration file to renew its content. After completion of the step Sa5, the IC tester performs testing of the IC in step Sa6.

According to the conventional calibration method of the IC tester described above, the calibration is provided to perform the timing correction with respect to all of the pins of the IC. For this reason, the calibration requires a relatively large rate in device measurement time.

In addition, a decision whether to perform the calibration greatly depends on the variation of temperature. This indicates that the conventional calibration method of the IC tester cannot cope with the timing deviation due to factors irrelevant to the variation of temperature such as the secular change and change of the hardware.

Further, the conventional calibration method is designed such that the calibration should be performed for a long time before testing of the IC even if the timing correction is not required regardless of the variation of temperature.

SUMMARY OF THE INVENTION

It is an object of the invention to provide a calibration method of an IC tester which is capable of reducing the time of calibration which is performed before testing of an IC.

A calibration method of this invention is provided for an IC tester which performs testing of ICs in association with a computer having a storage. A calibration file corresponding to results of calibration is stored by the computer. At first, the IC tester loads correction information representing results of a previous calibration from the computer. Then, a value of time propagation delay (TPD) is measured with respect to a pin selected from among pins of an IC and is compared with the correction information. The IC tester corrects a delay time provided for the pin whose value of TPD differs from the correction information. Thereafter, the correction information is renewed using the corrected delay time, so that the renewed correction information is stored by the computer.

The value of TPD is measured by supplying a calibration signal to the pin through a delay correction element which provides the delay time for the pin. Therefore, based on the result of the measurement, the IC tester controls the delay correction element to correct the delay time provided for the pin.

As described above, the IC tester completes the calibration prior to the testing of the IC. The correction of the delay time is made if the measured value of TPD is substantially different from the correction information, or if a prescribed time has already elapsed after the previous calibration. In addition, the pins of the IC can be partitioned into blocks, so that the value of TPD is measured with respect to a pin belonging to each of the blocks. Because the calibration is performed with respect to the selected pins only, it is possible to reduce calibration time which is required before the testing of the IC.

The above procedures of the calibration method are effective under a precondition that the calibration file exists in the storage of the computer. However, if no calibration file exists, the calibration is performed with respect to all of the pins of the IC.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENT

Figure 1:
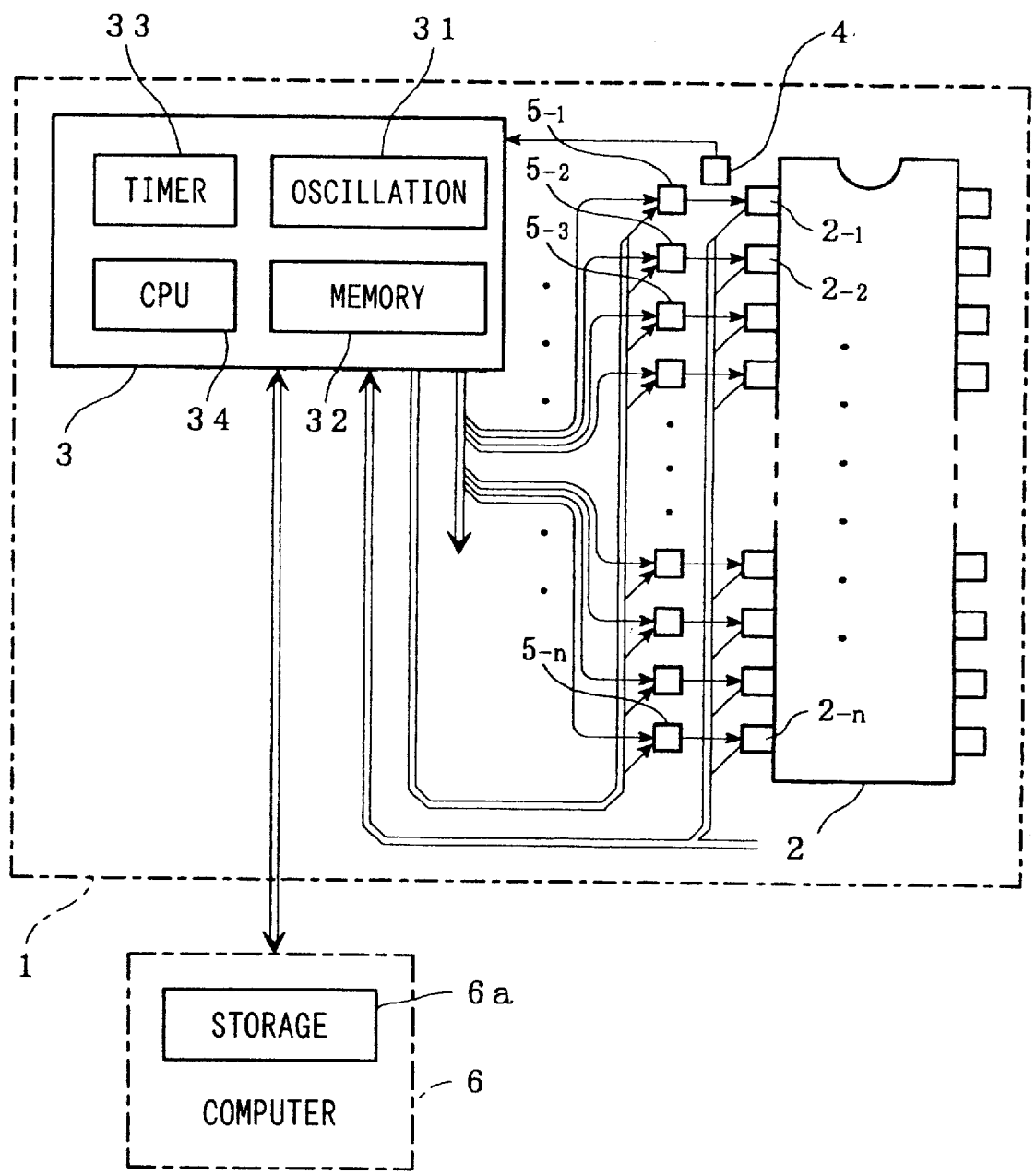
FIG. 1 is a block diagram showing a configuration of an IC tester employing a calibration method in accordance with an embodiment of the invention.

FIG. 1 is a block diagram showing a configuration of an IC tester 1 employing a calibration method in accordance with an embodiment of the invention. The IC tester 1 contains an IC socket (not shown) for packaging an IC 2, a control unit 3 and a temperature sensor 4. Herein, the IC 2 corresponds to any kinds of digital ICs such as memories and gate arrays. The control unit 3 performs testing and calibration of the IC 2 while the temperature sensor 4 detects temperature inside of the IC tester 1.

The control unit 3 includes an oscillation circuit 31, a memory 32, a timer circuit 33 and a CPU (i.e., Central Processing Unit) 34.

For the testing of the IC 2, the oscillation circuit 31 outputs test signals and calibration signals which are supplied to the IC 2.

The memory 32 corresponds to a semiconductor memory such as a RAM (i.e., Random-Access Memory) and a ROM (i.e., Read-Only Memory). The memory 32 stores procedures of the testing of the IC 2 as well as time delay values which correspond to results of the calibration.

The timer circuit 33 is configured using a counter circuit. In a calibration mode of the IC tester 1, the timer circuit 33 is used to measure time delay values or time which elapse after starting the calibration.

The aforementioned oscillation circuit 31, memory 32 and timer circuit 33 are controlled by the CPU 34.

The IC 2 has a number of pins which are denoted by numerals of 2-1, 2-2, ..., 2-n respectively (where 'n' is an integer). Each of the pins is denoted by a representative numeral of "2-n". The control unit 3 supplies the test signals and calibration signals to each of the pins or to some of the pins.

The control unit 3 loads the calibration signal with respect to each pin "2-n". Thus, it is possible to calculate a time delay value from the control unit 3 to each pin 2-n.

The aforementioned signals are transmitted from the control unit 3 to the pins via signal lines. Delay correction elements 5-1, 5-2, ..., 5-n are provided for the signal lines with respect to the pins 2-1, 2-2, ..., 2-n respectively. Each of the delay correction elements is denoted by a representative numeral of "5-n". An amount of delay of each delay correction element 5-n is controlled by a control signal output from the control unit 3.

A computer 6 has a display and a keyboard for inputting data, commands and the like. Using the computer 6, a human operator designates the start of the testing of the IC 2 as well as the start of the calibration. In addition, the computer 6 contains a storage unit 6a using recording media such as the magnetic tapes. The storage unit 6a stores calibration files containing calibration data such as timing correction values which are calculated based on results of the calibration.

Figure 2:
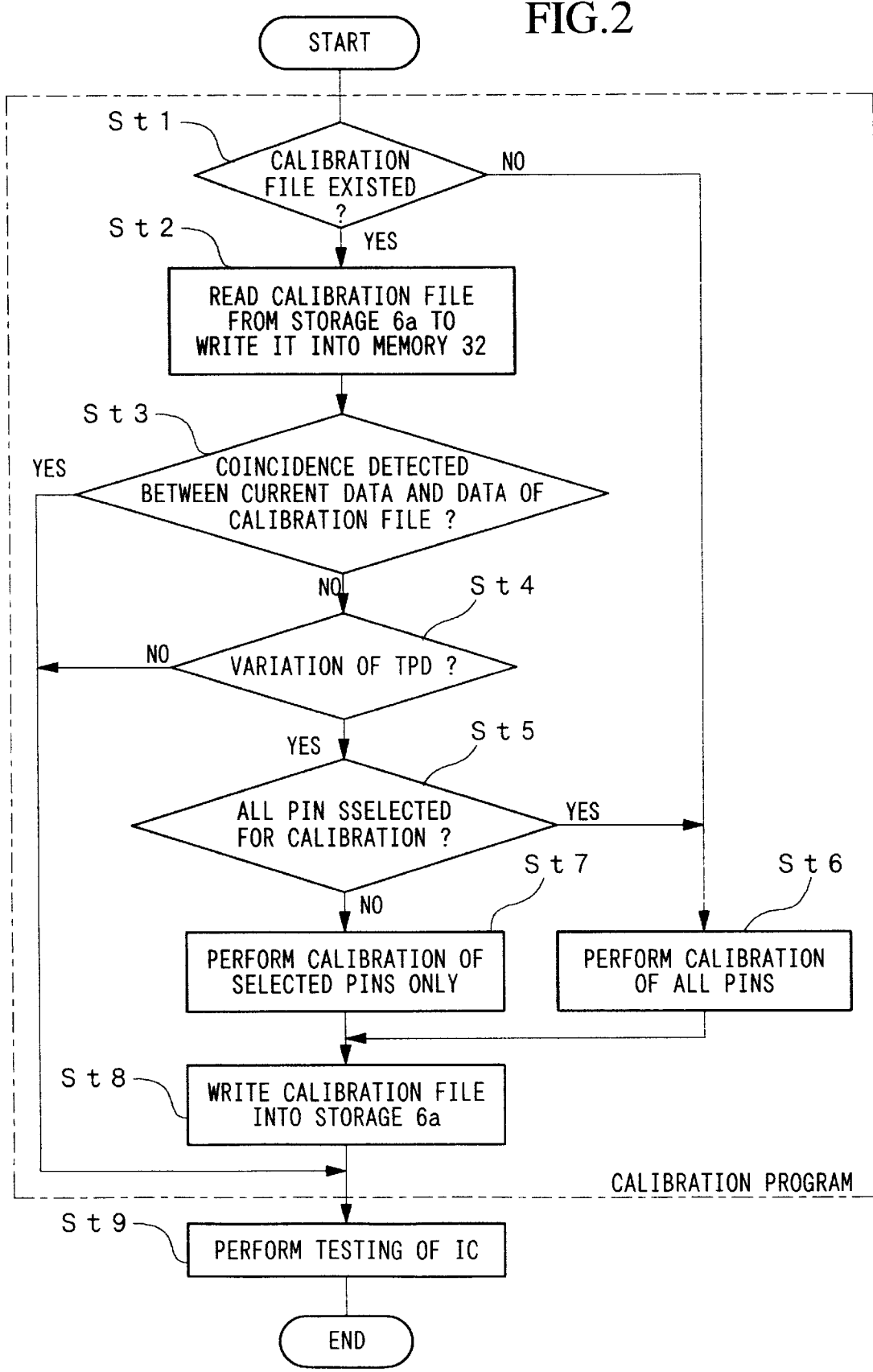
FIG. 2 is a flowchart showing procedures of a calibration program.
Figure 3:
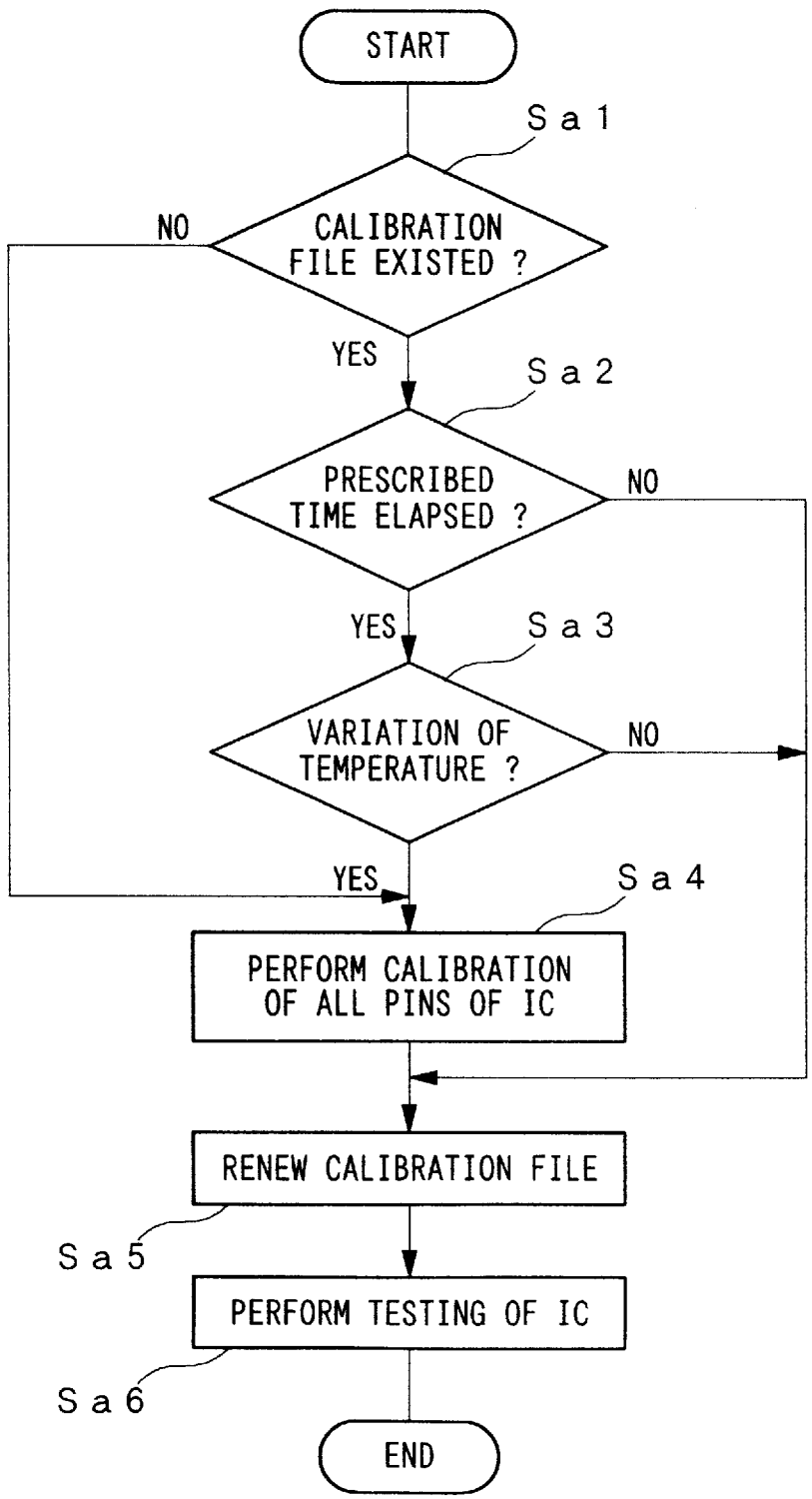
FIG. 3 is a flowchart showing procedures that the conventional IC tester performs for preparation of testing of an IC.

FIG. 2 is a flowchart showing a flow of steps in accordance with an embodiment of the invention. The flowchart of FIG. 2 shows procedures in processing of the CPU 34. Normally, the procedures are written into the memory 32 (e.g., ROM) in advance.

It is possible to store multiple test programs in the storage unit 6a in advance with respect to multiple kinds of ICs which are subjected to testing of the IC 2. In this case, the human operator gives an instruction to the computer 6 so that an appropriate one of the test programs is read from the storage unit 6a and is written into the memory 32 (e.g., RAM). The CPU 34 executes the test program written in the memory 32.

Given an instruction to start testing, the control unit 3 confirms whether or not a calibration file exists in step St1. That is, the control unit 3 detects whether or not calibration was carried out previously at least one time.

If the control unit 3 confirms existence of the calibration file, the calibration file is read from the storage unit 6a and is then written into the memory 32 in step St2. If the calibration file does not exist, the IC tester 1 (actually, the CPU 34) proceeds to step St6, the content of which will be described later.

After the control unit 3 loads the calibration file from the storage unit 6a in step St2, the control unit 3 accesses the timer circuit 33 and the temperature sensor 4 to read current data. That is, the control unit 3 reads time data from the timer circuit 33 while reading temperature data from the temperature sensor 4. In addition, the control unit 3 further reads other data from parts (not specified) of the IC tester and the like according to needs. Thus, it is possible to provide a set of current data against preset data (or previous data) of the calibration file.

Then, the CPU 34 proceeds to step St3. That is, the CPU 34 confirms whether or not the current data coincides with the preset data of the calibration file, or whether or not the current data substantially coincides with the preset data of the calibration file within a margin of prescribed values. In addition, the CPU 34 confirms whether or not a prescribed time has elapsed since the previous calibration.

If the CPU 34 detects coincidence between the current data and preset data or substantial coincidence between them within a margin of prescribed values, or if the prescribed time has not elapsed since the previous calibration, the CPU 34 proceeds to step St9, the content of which will be described later.

On the other hand, if the current data does not coincide with the preset data of the calibration file, in other words, if differences between the current data and preset data exceed a range of the prescribed values, or if the prescribed time has elapsed since the previous calibration, the CPU 34 proceeds to step St4. Herein, some of the pins of the IC 2 are selected as calibration points. So, the CPU 34 confirms whether or not a change occurs in TPD (i.e., Time Propagation Delay) with respect to the calibration points.

In the present embodiment, multiple pins of the IC 2 (denoted by the numerals of 2-1 to 2-n respectively) are partitioned into multiple blocks each containing a number of pins. Herein, a certain pin represented by a numeral "2-x" (where x ranges between 1 and n) is set in advance for each of the blocks. A delay correction element corresponding to the pin 2-x is represented by a numeral "5-x" (where x ranges between 1 and n).

In the calibration, the control unit 3 supplies a calibration signal to the pin 2-x via the delay correction element 5-x. Then, the control unit 3 inputs the calibration signal to measure a propagation time (i.e., TPD).

The CPU 34 confirms whether or not a value of the TPD coincides with a preset value which has been already written in the calibration file (see step St4).

In the event that no variation occurs in TPD in the step St4, the CPU 34 proceeds directly to step St9.

In contrast, if a variation occurs in TPD, the CPU 34 proceeds to step St5 to confirm, based on the test programs written in the memory 32 as well as the test programs and data written in the storage unit 6a, as to whether or not all the pins are selected for the calibration.

If it is confirmed that all the pins are selected for the calibration, the CPU 34 proceeds to step St6 to perform the calibration with respect to all the pins. After completion of the calibration with respect to all the pins, the control unit 3 supplies control signals (representing timing correction values) to the corresponding delay correction elements, so that delay times are corrected.

On the other hand, if it is confirmed in step St5 that all the pins are not selected for the calibration, the CPU 34 proceeds to step St7 so that the calibration is performed with respect to only prescribed pins selected from among the pins of the IC 2.

After completion of the calibration in accordance with the step St6 or step St7, the control unit 3 obtains data representing timing correction values, temperature, time to perform the calibration and the like. Then, the data is written into the storage unit 6a as a new content of the calibration file in step St8. Thereafter, the CPU 34 proceeds to step St9 to perform testing of the IC 2.

As described heretofore, the present embodiment detects a variation of TPD at a calibration point (e.g., pin 2-x) arbitrarily selected. Therefore, the present embodiment is capable of performing calibration with respect to only the pin corresponding to the variation of TPD or with respect to only the block containing the pin corresponding to the variation of TPD.

As a result, it is possible to complete the calibration in a short period of time prior to testing of an IC.

In short, this invention provides a variety of advantages, some of which can be described as follows:

(1) The calibration method of this invention is designed to measure values of TPD with respect to only the prescribed pins within the pins of a testing IC, so that the values of TPD are compared with correction information, corresponding to results of the previous calibration, which is read from the storage unit. So, the delay time is corrected with respect to only the pin(s) whose value of TPD differs from the correction information. Then, a value of correction is written into the storage unit as the correction information. Thus, it is possible to reduce a calibration time required for the calibration which is performed prior to testing of the IC.

(2) According to one aspect of the calibration method of this invention, a decision is made as to whether to perform "overall" calibration on the basis of a result of measurement of TPD of a certain calibration point of the IC. Based on the decision, it is possible to perform the calibration with accuracy.

(3) This invention provides a flexibility in execution of the calibration. For example, the execution of the calibration can be made selectively in response to a variation of TPD with respect to a calibration point of a certain block arbitrarily selected. Or, the execution of the calibration can be made selectively in response to a change of the hardware of the IC tester.

(4) The present embodiment can be easily modified such that delay-time corrections are made valid with respect to only a certain block which is subjected to calibration. Thus, it is possible to greatly reduce a calibration time.

In other words, it is possible to greatly reduce a rate of the calibration time within the total measurement time of the device (e.g., IC).

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A calibration method of an IC tester which comprises
   signal supply means for supplying test signals to a plurality of pins of an IC respectively;
   delay correction means provided between the signal supply means and the plurality of pins respectively;
   control means for controlling correction values of the delay correction means; and
   storage means for storing correction information containing the correction values used in calibration,
   said calibration method of the IC tester comprising the steps of:
   reading the correction information regarding a previous calibration from the storage means;
   measuring a value of time propagation delay with respect to a prescribed pin selected from among the plurality of pins;
   comparing the value of time propagation delay with the correction information regarding the previous calibration;
   controlling a correction value of the delay correction means with respect to the prescribed pin whose value of time propagation delay differs from the correction information; and
   writing correction information containing the correction value of the delay correction means controlled by the control means into the storage means.

2. A calibration method of the IC tester as defined in claim 1 further comprising the steps of:
   partitioning the plurality of pins of the IC into a plurality of blocks, so that a value of time propagation delay is measured with respect to a single pin from each of the plurality of blocks and is compared with the correction information; and
   controlling correction values of the delay correction means with respect to all of the pins belonging to the block whose value of time propagation delay measured differs from the correction information.

3. A calibration method of the IC tester as defined in claim 1 which further comprises timer means for specifying a time to perform the calibration and temperature detecting means for detecting temperature of atmosphere in the IC tester so that the correction information contains the time to perform the calibration as well as the temperature of the atmosphere,
   said calibration method of the IC tester further comprising the step of:
   controlling correction values of the delay correction means with respect to all of the plurality of pins of the IC if a prescribed time has elapsed after the time to perform the calibration which is indicated by the correction information, or if a prescribed variation of temperature or more is detected in the temperature of the atmosphere after the time to perform the calibration.

4. A calibration method of an IC tester, which is performed prior to testing of an IC, comprising the steps of:

loading a calibration file which stores correction information with respect to a previous calibration;

measuring a value of time propagation delay (TPD) with respect to a pin selected from among a plurality of pins of the IC which is subjected to testing;

comparing the measured value of time propagation delay with the correction information regarding the previous calibration;

correcting a delay time provided for the pin whose value of time propagation delay differs from the correction information; and renewing the correction information to incorporate the corrected delay time.

5. A calibration method of an IC tester, which is performed prior to testing of an IC, comprising the steps of:

confirming whether or not a calibration file exists; and correcting delay times respectively provided for all of a plurality of pins of an IC only if the calibration file does not exist.

6. A calibration method of the IC tester which is performed prior to testing of an IC, comprising the steps of:

loading a calibration file which stores correction information with respect to a previous calibration;

measuring a value of time propagation delay (TPD) with respect to a pin selected from among a plurality of pins of the IC which is subjected to testing;

comparing the measured value of time propagation delay with the correction information;

correcting a delay time provided for the pin whose value of time propagation delay differs from the correction information, wherein the delay time is corrected if the measured value of time propagation delay is substantially different from the correction information, or if a prescribed time has already elapsed after the previous calibration; and renewing the correction information to incorporate the corrected delay time.

7. A calibration method of the IC tester as defined in claim 4 wherein the plurality of pins of the IC are partitioned into a plurality of blocks, so that the value of time propagation delay is measured with respect to a single pin from each of the plurality of blocks.

8. A calibration method of the IC tester as defined in claim 6 wherein the plurality of pins of the IC are partitioned into a plurality of blocks, so that the value of time propagation delay is measured with respect to a single pin from each of the plurality of blocks.

* * * * *